US00RE35036E

United States Patent [19]

Yabu et al.

[11] E Patent Number: Re. 35,036

[45] Reissued Date of Patent: Sep. 12, 1995

[54] METHOD OF MAKING SYMMETRICALLY CONTROLLED IMPLANTED REGIONS USING ROTATIONAL ANGLE OF THE SUBSTRATE

[75] Inventors: Toshiki Yabu, Moriguchi; Michihiro Inoue, Ikoma; Takashi Ozone, Moriguchi, all of Japan

[73] Assignee: Matsushita Electric Industrial Co., Ltd., Osaka, Japan

[21] Appl. No.: 4,652

[22] Filed: Jan. 14, 1993

Related U.S. Patent Documents

Reissue of:

[64] Patent No.: 4,771,012
Issued: Sep. 13, 1988
Appl. No.: 61,264
Filed: Jun. 12, 1987

U.S. Applications:

[63] Continuation of Ser. No. 581,781, Sep. 13, 1990, abandoned.

[30] Foreign Application Priority Data

Jun. 13, 1986 [JP] Japan ..... 61-138501
Jun. 13, 1986 [JP] Japan ..... 61-138558

[51] Int. Cl.[6] ..... H01L 21/265

[52] U.S. Cl. ..... 437/29; 437/35; 437/44; 437/45

[58] Field of Search ..... 437/29, 35, 44, 45

[56] References Cited

U.S. PATENT DOCUMENTS

| | | | |
|---|---|---|---|
| 4,086,694 | 5/1978 | Rangoon | 29/579 |
| 4,232,439 | 11/1980 | Shibata | 437/35 |
| 4,325,747 | 6/1982 | Ristow | 437/35 |
| 4,329,186 | 5/1982 | Kotecha et al. | 148/1.5 |
| 4,335,503 | 6/1982 | Evans, Jr. et al. | |
| 4,377,899 | 3/1983 | Otani et al. | 437/35 |
| 4,390,391 | 6/1983 | Fujita et al. | 156/628 |
| 4,404,233 | 9/1983 | Ikeda et al. | 437/35 |
| 4,444,616 | 4/1984 | Fujita et al. | 156/628 |
| 4,466,178 | 8/1984 | Soclof | 29/576 B |
| 4,508,056 | 4/1985 | Bruel et al. | 118/730 |
| 4,604,150 | 8/1986 | Lin | 148/188 |

FOREIGN PATENT DOCUMENTS

| | | | |
|---|---|---|---|
| 56-6152 | 2/1981 | Japan . | |
| 58-19422 | 2/1983 | Japan . | |
| 0198763 | 11/1984 | Japan | 437/45 |

*Primary Examiner*—Robert Kunemund
*Attorney, Agent, or Firm*—Wenderoth, Lind & Ponack

[57] ABSTRACT

A method of fabricating a field effect transistor, wherein impurity diffusion layers of source and drain are formed by an ion implantation method using the gate electrode as the mask by inclining the semiconductor substrate with respect to the ion beam incident direction so as to prevent the channeling effect and also rotating it in planarity with respect to the ion beam scanning plane. As a result, impurity diffusion layers can be formed symmetrically with respect to the gate electrode.

10 Claims, 10 Drawing Sheets

2-D simulated impurity profile of LDD n-MOSFET

METHOD OF MAKING SYMMETRICALLY CONTROLLED IMPLANTED REGIONS USING ROTATIONAL ANGLE OF THE SUBSTRATE

Matter enclosed in heavy brackets [ ] appears in the original patent but forms no part of this reissue specification; matter printed in italics indicates the additions made by reissue. *This application is a Continuation of now abandoned application, Ser. No. 07/581,781, filed Sep. 13, 1990.*

BACKGROUND OF THE INVENTION

This invention relates to a method of fabricating a field effect transistor, and more particularly to a method of fabricating a field effect transistor by forming an impurity diffusion layer by ion implantation method using a gate electrode as the mask.

Conventionally, in the method of fabricating a field effect transistor, as the process of forming an impurity diffusion layer such as a source and drain region after forming a gate electrode, the method of forming by ion implantation using the gate electrode as the mask is widely employed. At this time, in order to prevent the channeling effect of the impurity ions into the semiconductor substrate, it is a general practice to implant by inclining the normal of the semiconductor substrate surface 11 by $\theta$ degrees, usually about 7 degrees, with respect to the ion beam incident direction 14 as shown in FIG. 1.

In this method, however, as the device becomes smaller and smaller, the junction depth of the impurity diffusion layer becomes shallower, and the heat treatment is lowered in temperature, which results in a shade or shadow part 26 in the gate electrode 23 as shown in FIG. 2, so that the impurity diffusion layer 25 may be asymmetrical with respect to the gate electrode 23. Moreover, the device having such an assymmetrical shape is also influenced in the electric characteristics. For example, effects of the asymmetrical shape on the electric characteristics in a MOS field effect transistor having an LDD (lightly doped drain) structure are as follows. FIG. 3 is a two-dimensional simulation diagram of impurity distribution in the section along the channel longitudinal direction in an LDD structure MOS transistor fabricated so that the LDD region may be asymmetrical with respect to the gate electrode. In this example, the process and device parameters are as follows. The impurity doping for threshold voltage control is boron with 40 keV, $4.0\times10^{12}$ dose/cm$^2$, the impurity doping for the LDD region is phosphorus with 40 keV, $1.0\times10^{13}$ dose/cm$^2$, and the impurity doping for the source and drain region is arsenic with 80 keV, $4.0\times10^{15}$ dose/cm$^2$. The gate oxide film thickness is 10 nm, the gate electrode height is 450 nm, the gate electrode length is 0.8 $\mu$m, the width of an insulation film sidewall spacer is 0.14 $\mu$m, and the total heat treatment process after forming the gate electrode is 30 min at 900° C. The source and drain regions were formed to be symmetrical with respect to the gate electrode. As clear from FIG. 3, the portion becoming the shade or shadow of the gate electrode at the time of ion implantation is the area where the end portion of the LDD region is offset with respect to the end of the gate electrode. The drain current characteristic of the device fabricated with said parameters is given in FIG. 4. The method of fabrication conformed to the method proposed, for example, by Paul J. Tsang et al., "Fabrication of High-Performance LDD FET's with Oxide Sidewall-Spacer Technology," IEEE TRANSACTIONS ON ELECTRON DEVICES, vol. ED-29, No. 4, April 1982. In the operation where the source region is offset (forward operation), since a high resistance region is formed at the source side, the drain current (ID) becomes lower. On the other hand, in the operation where the drain region is offset (reverse operation), a high resistance region is formed at the drain side, and the saturation voltage is higher, so that the drain current becomes higher. Thus, when the impurity diffusion layer becomes asymmetrical to the gate electrode, an asymmetricity occurs in the electric characteristics of the device, and it is hard to apply into a highly integrated circuit.

SUMMARY OF THE INVENTION

It is hence a primary object of this invention to present a method of fabricating a field effect transistor capable of forming an impurity diffusion layer symmetrical to the gate electrode and obtaining a symmetricity in the electric characteristics of the device, when forming the impurity diffusion layer by an ion implantation method using the gate electrode as the mask.

In order to achieve the above object, the method of fabricating a field effect transistor of this invention is intended to implant ions by inclining the semiconductor substrate with respect to the ion beam incident direction; in order to prevent the channeling effect and also subjecting said semiconductor substrate to plane rotation with respect to the ion beam scanning plane, when forming the impurity diffusion layer by an ion implantation method using the gate electrode as the mask.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
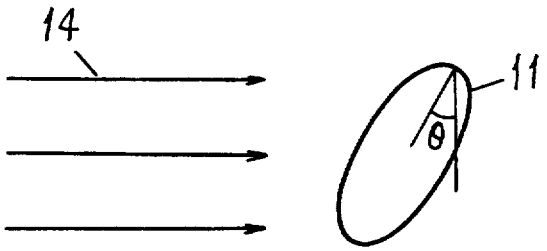
Fig. 1 PRIOR ART
FIG. 1 is an illustration to explain a conventional method of implanting ions by inclining the semiconductor substrate with respect to the ion beam incident direction in order to prevent the channeling effect.
Figure 2:
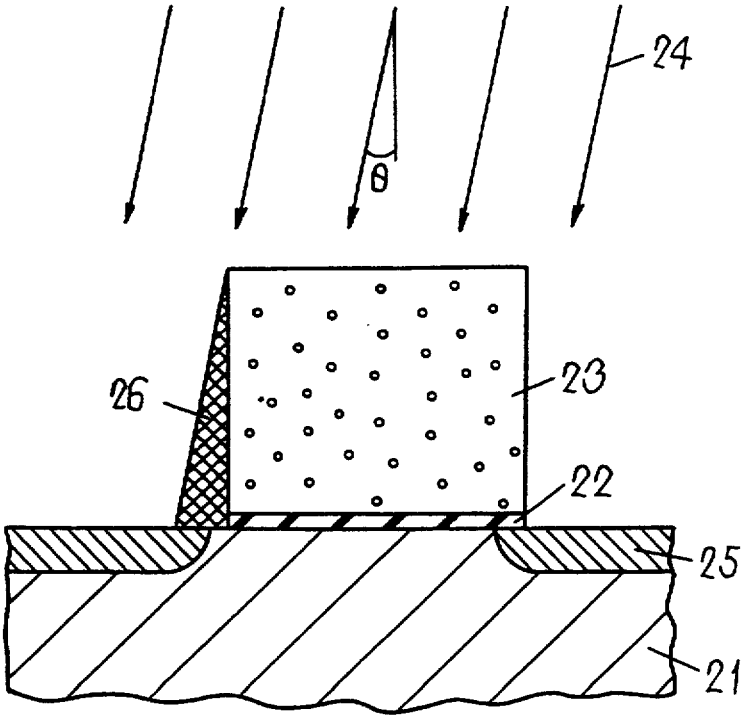
Fig. 2 PRIOR ART
FIG. 2 is a sectional view to explain an asymmetrical formation of an impurity diffusion layer with respect to the gate electrode.
Figure 3:
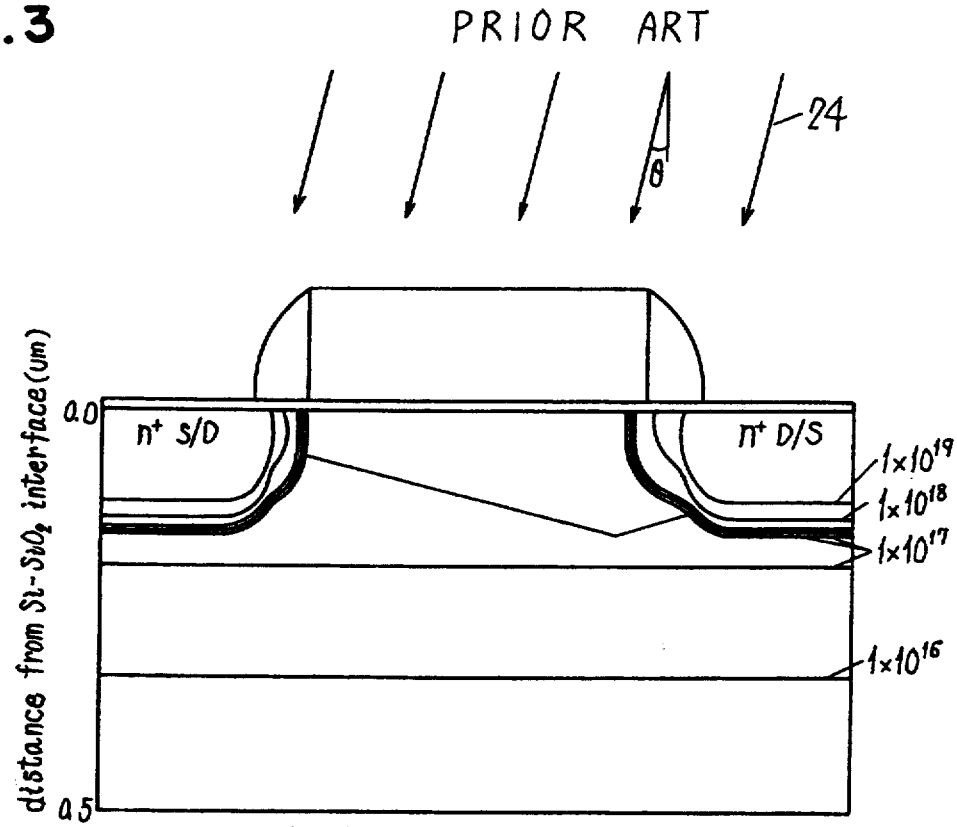
FIG. 3 is a two-dimensional simulation illustration of impurity distribution in the section along the channel longitudinal direction in an LDD structure MOS field effect transistor with the LDD region formed asymmetrically with respect to the gate electrode.
Figure 4:
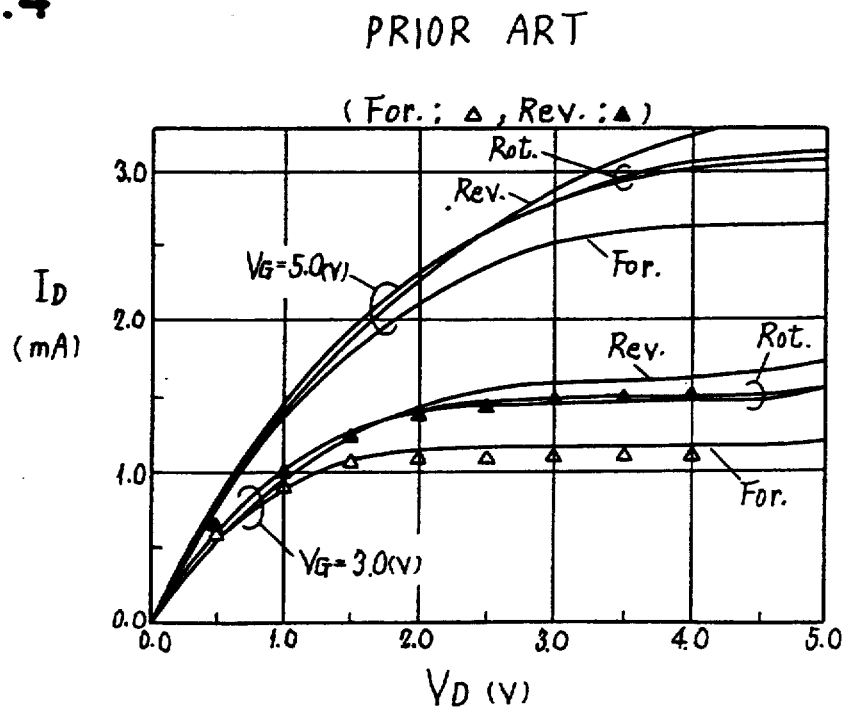
FIG. 4 is a graph to show the drain current characteristic result in an LDD structure MOS field effect transistor.
Figure 5A:
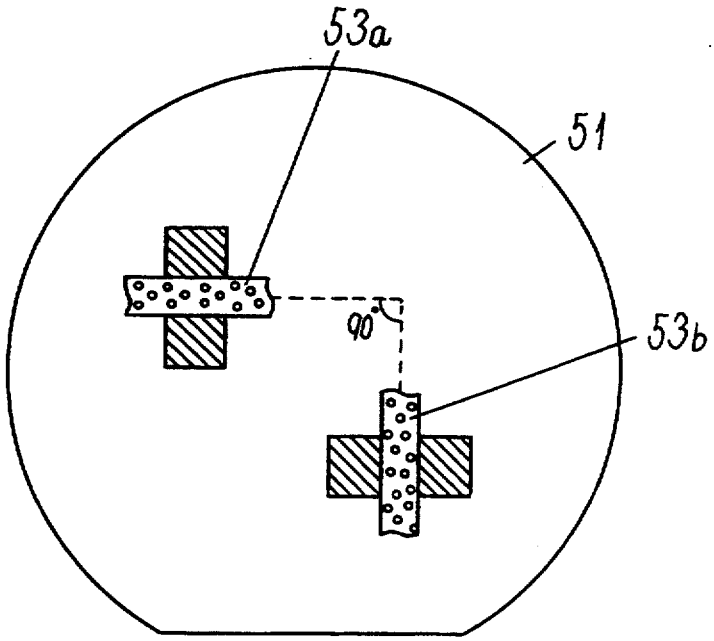
FIGS. 5A to 5E are illustrations to explain the method steps of ion implantation in one of the embodiments of this invention.
Figure 5B:
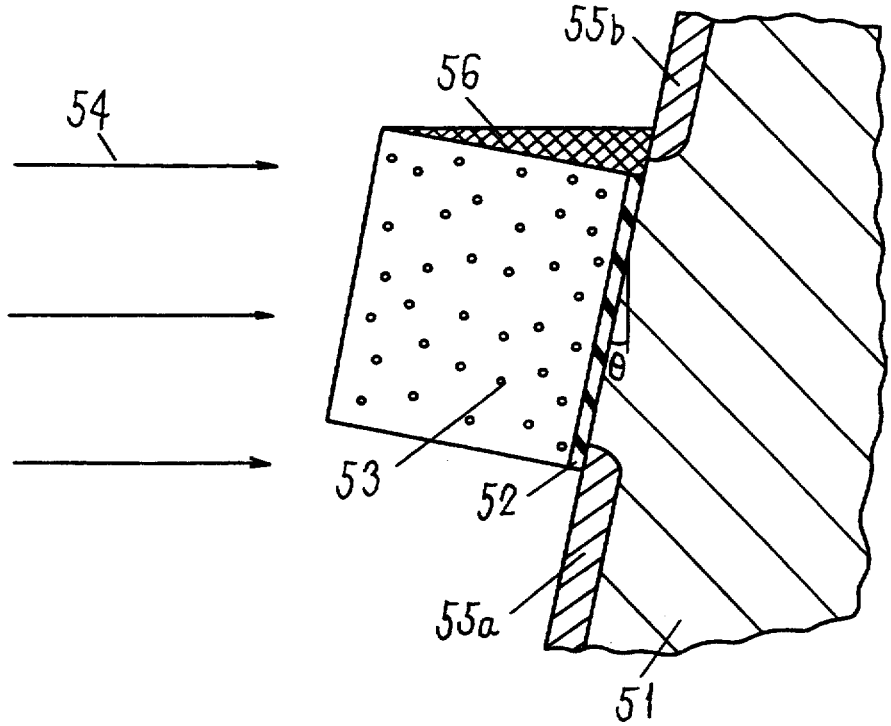
Figure 5C:
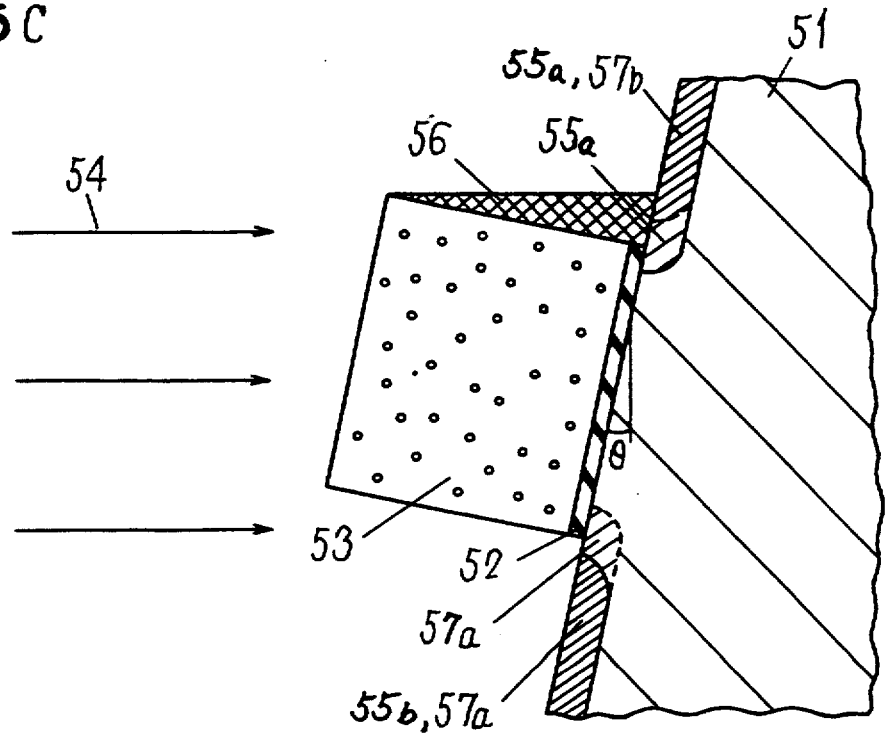

Referring now to FIGS. 5A to 5E, the ion implantation method to realize this invention is described below, illustrating an example of a MOS field effect transistor. In the actual semiconductor integrated circuit, as shown in FIG. 5A, the gate electrode is designed, in most cases, so that 53a and 53b may orthogonally intersect with each other on the semiconductor substrate 51. That is, the gate of a MOS field effect transistor mostly runs in two directions. Therefore, in the conventional single ion implantation step, the shade or shadow of the gate electrode is inevitably formed. In view of this point, an object of the present invention is to form the impurity diffusion layer by the following ion implantation method. When forming an impurity diffusion layer by ion implantation using the gate electrode 53 as the mask on the semiconductor substrate 51 on which a gate insulation film 52 and a gate electrode 53 are formed, in order to prevent the channeling effect, the semiconductor substrate 51 is inclined by an angle $\theta$ (for example, 7 degrees) with respect to the the normal of the ion beam incident direction 54, and ions are implanted. At this time, as shown in FIG. 5B, depending on the configuration of the gate electrode on the semiconductor substrate, a shade or shadow 56 of the gate electrode is formed, and the formed impurity diffusion layer (for example, the source and drain of the field effect transistor) becomes as indicated by 55a and 55b, and it is formed asymmetrically with respect to the gate electrode. However, in succession, when ion implantation is effected in the same conditions after 180-degree plane rotation of the semiconductor substrate 51 with respect to the ion beam scanning plane, the impurity diffusion layer may be formed symmetrically with respect to the gate electrode, as shown in FIG. 5C, such as the region 55a and the region 55a and 57b, and the region 55b and the region 55b and 57a, so that a symmetricity is obtained in the electric characteristics of the device. On the semiconductor integrated circuit, meanwhile, whatever the direction of gate electrode configuration may be, the problems of asymmetrical shape of individual transistors may be solved. Thus, by the second ion implantation, after the first step, by 180-degree plane rotation of the semiconductor substrate with respect to the ion beam scanning plane, the asymmetrical shape of the impurity diffusion layer with respect to the gate electrode, at least, may be improved. At this time, the dose of each ion implantation is half of the total dose.

Figure 5D:
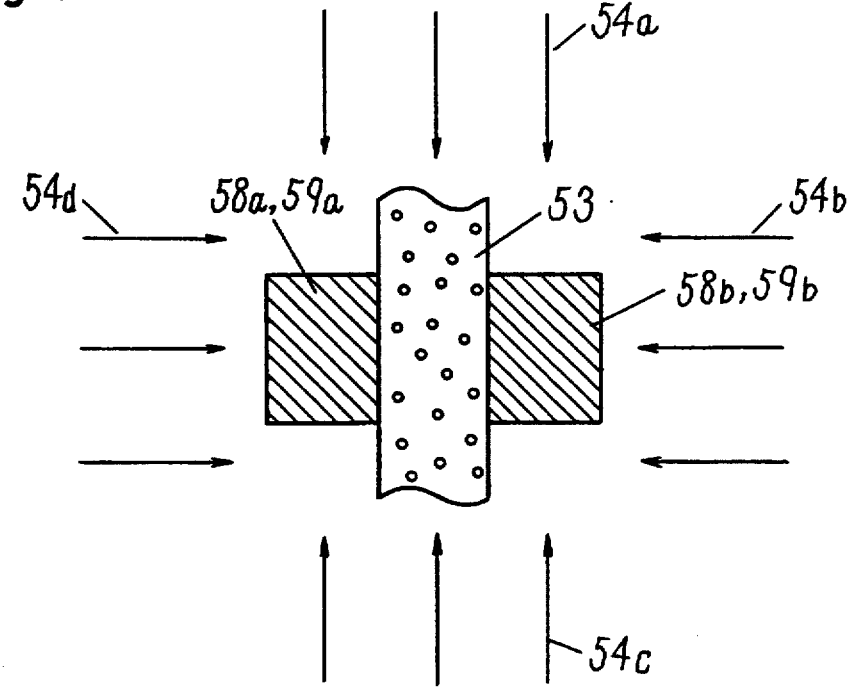
Figure 5E:
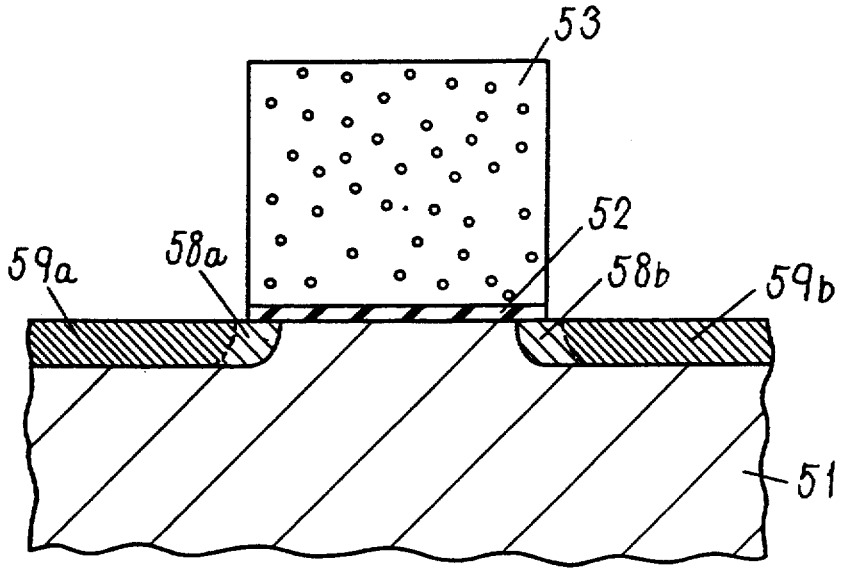

Furthermore, in a semiconductor integrated circuit, if it is necessary to adjust the electric characteristics of individual transistors strictly, the semiconductor substrate is placed, as shown in FIG. 5D, so that the ion beams may enter in the direction 54a parallel to the gate electrode 53 for the first ion implantation. Next, after a 90-degree plane rotation of the semiconductor substrate, a second ion implantation is effected from the direction 54b orthogonal to the gate electrode 53. Similarly, ions are implanted from directions 54c and 54d. That is, ions are implanted in a total of four steps by rotating the semiconductor substrate by 90 degrees each step. At this time, the dose of each implantation is one fourth of the total dose. As a result, two effects are obtained. First, while 55a and 57a of the impurity diffusion layer obtained by the two-rotation ion implantation in FIG. 5C is about half of the total dose, 58a and 58b of the impurity diffusion layer obtained by the four-rotation ion implantation in FIG. 5E is about three-fourths of the total dose, so that a diffusion layer closer to the desired impurity concentration may be obtained. Second, since the gate electrodes of the transistor are designed to be arranged orthogonally in a semiconductor integrated circuit as shown in FIG. 5A, 55a and 57a of the impurity diffusion layer obtained by the two-rotation ion implantation in FIG. 5C are not formed in the same shape if the gate electrode is arranged as 53a and 53b. That is, the asymmetricity of the diffusion layer is improved, but the shape of the diffusion layer in individual transistors cannot be uniformly adjusted, and the electric characteristics cannot be matched strictly. On the other hand, 58a and 58b of the impurity diffusion layer obtained by the four-rotation ion implantation in FIG. 5E can be formed nearly in the same shape regardless of the gate electrode configuration, so that the electric characteristics of the transistors may be nearly matched.

Thus, by four-rotation ion implantation, not only the asymmetricity of the impurity diffusion layer can be improved, but also a desired performance may be obtained in the electric characteristics of the transistor regardless of gate electrode configuration.

Incidentally, the ion implantation method in this method is not limited to two or four implantations, but the ion implantations may be performed 2n times (where n is a positive integer). That is, in order to cancel the shade or shadow of the gate electrode, after at least one ion implantation, another ion implantation is effected by rotating the semiconductor substrate by 180 degrees. The angle of rotation may be arbitrary, but in order to match the electric characteristics of transistors in a semiconductor integrated circuit, particularly, 360 degrees/4 m times (m is a positive integer) should be desired, and it is preferable that the gate electrode configuration of the transistor in the circuit design should also conform to this angle. Furthermore, when rotating the semiconductor substrate, it may be also possible to implant ions once while rotating the substrate continuously k times (k being a positive integer such as 1), but at this time, the rotation necessary for implanting a necessary dose, that is, the rotating speed of the semiconductor substrate when implanting ions, must be at least faster than one revolution per one implantation.

As one of the embodiments, herein, an example of the application of this invention to a method of fabricating a MOS field effect transistor having an LDD structure is described while referring to the process steps shown in FIGS. 6A to 6G. This embodiment relates to the two-rotation ion implantation steps, in which the sectional view along the channel longitudinal direction is shown.

Figure 6A:
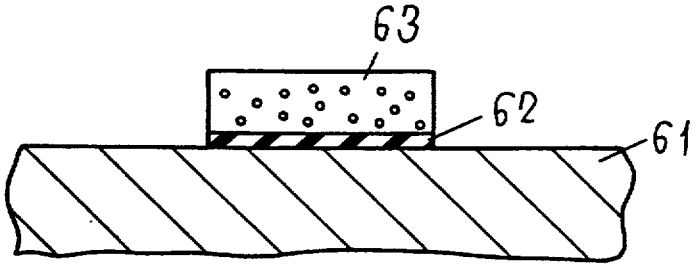
FIGS. 6A to 6G are process drawings of the sectional view along the channel longitudinal direction to show an example of application of this invention to a method of fabricating an LDD (lightly doped drain) MOS field effect transistor.

In the first place, a gate insulation film 62 is formed in a film thickness of 10 mm on a semiconductor substrate surface (P-type Si) 61, and a polysilicon film 63 is formed, and a gate electrode is formed by patterning with resist (FIG. 6A).

Figure 6B:
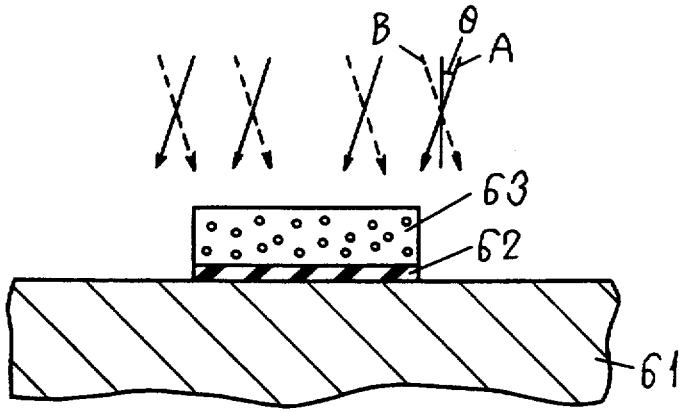
Figure 6C:
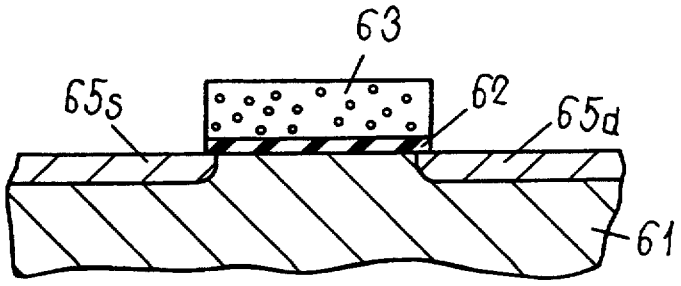

Next, in order to form an LDD region, ions are implanted using the gate electrode as the mask, and a first source region 65s and a drain region 65d are formed (FIGS. 6B and C). At this time, the ion implantation angle is inclined 7 degrees with respect to a normal to the semiconductor substrate surface in order to prevent the channeling effect of impurities. That is, first ions are implanted into the semiconductor substrate surface vertically with respect to the channel widthwise direction and in the source or drain direction with respect to the channel longitudinal direction (FIG. 6B, solid-line arrow A), and by a 180-degree plane rotation by the semiconductor substrate ions are implanted by inclining so as to enter the other drain or source region (FIG. 6B, broken-line arrow B), so that a desired impurity ion dose is achieved (FIG. 6C). As the impurity, phosphorus was used, and the implantation energy was 40 keV, and the dose was $1.0\times10^{13}$ dose/cm$^2$ in total. A single implantation dose was $2.5\times10^{12}$ dose/cm$^2$.

Figure 6D:
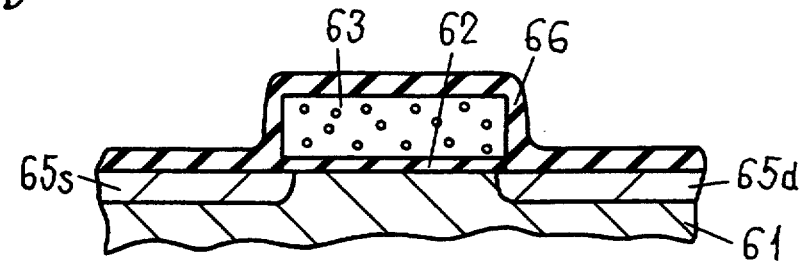
Figure 6E:
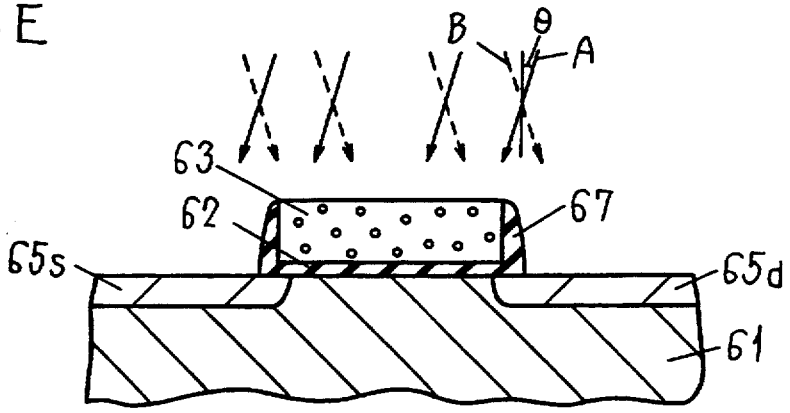
Figure 6F:
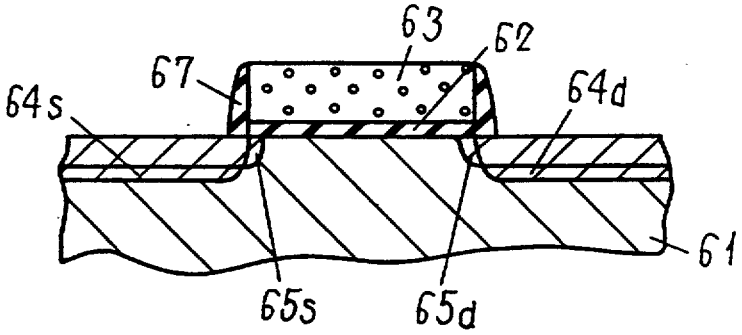
Figure 6G:
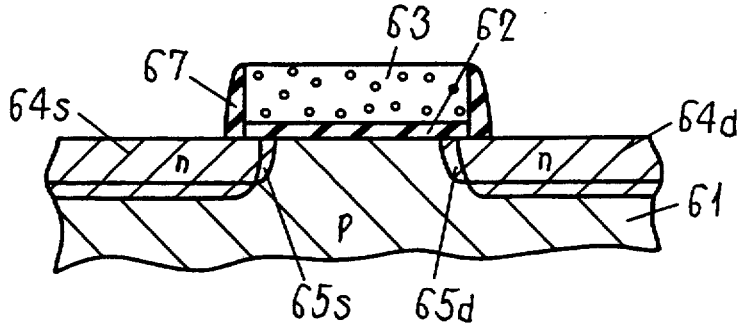

After forming the first source and drain regions 65s and 65d (FIG. 6C), in order to form the insulation film sidewall spacer of the gate electrode, a CVD-$SiO_2$ film 66 is formed (FIG. 6D). By reactive ion etching (RIE), the CVD-$SiO_2$ film 66 is subjected to anisotropic etching, and the CVD-$SiO_2$ film 66 formed on the flat part is removed (FIG. 6E). After this step, only the $SiO_2$ film around the gate electrode is left over, and an insulation film sidewall spacer 67 is formed by part of the CVD-$SiO_2$ film 66. Here, the width of the insulation film sidewall spacer is set at 0.14 μm. Consequently, in order to form the regular source and drain regions (n+ layers), ions are implanted in both A and B directions the same as when forming the first source and drain region (FIG. 6B), and a second source region 64s and drain region 64d are formed (FIG. 6F), thereby composing an LDD structure n-MOS FET. As the impurity, arsenic was used, and the implantation energy was 80 keV, and the dose was $4\times10^{15}$ dose/cm$^2$ in total. Each implantation dose was $1.0\times10^{15}$ dose/cm$^2$. Finally, after heat treatment, the source and drain regions of the LDD structure are formed symmetrical to the gate electrode as shown in FIG. 6G. Here, the source 64s and drain 64d regions were also formed by two-rotation ion implantation in order to avoid the possibility of asymmetricity of the LDD region length.

In this way, according to this embodiment, by forming the LDD structure having source and drain regions symmetrically with respect to the gate electrode, the transistor characteristics may be also obtained symmetrically regardless of the direction of source and drain.

In the steps shown in FIGS. 6B and 6E, meanwhile, by setting each ion implantation dose to one fourth of the total dose and rotating the semiconductor substrate by 90 degrees for each dose, it is also possible to implant ions by rotating the substrate four times, which is suited to the .semiconductor integrated circuit with the gate configuration as shown in FIG. 5A. Similarly, it is also possible to implant ions while rotating the semiconductor substrate continuously.

Incidentally, the transistor shown in FIG. 6 is an n-channel MOS, but it is evident that this invention may be similarly applied to a p-channel MOS transistor, too.

Figure 7:
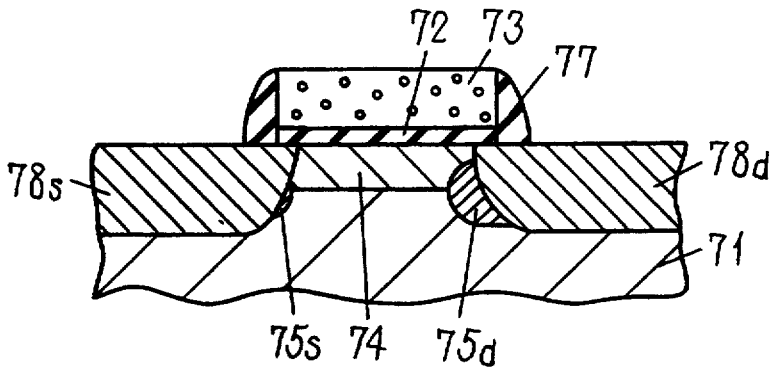
FIG. 7 is a sectional view along the channel longitudinal direction to show an asymmetrical formation of an n-type EPS (efficient punchthrough stops) region in an EPS structure MOS field effect transistor.

The ion implantation method of this invention is not limited to application into the LDD region or source/-drain region. When forming an impurity diffusion layer inside the semiconductor substrate using the gate electrode as the mask, this invention is extremely effective. That is, as compared with the case of implanting impurity ions onto the semiconductor substrate surface, when implanting impurity ions inside the semiconductor substrate, the ion implantation energy is high, and the distance of penetration of the impurity is long, so that the effect of the shade or shadow portion of the gate electrode is greater. For example, the asymmetricity is particularly obvious in the MOS field effect transistor having an EPS (efficient punchthrough stops) structure as shown in FIG. 7 (S. Odanaka et al., "A New Half-Micrometer p-Channel MOSFET with Efficient Punchthrough Stops", IEEE TRANSACTIONS on ELECTRON DEVICES, vol. ED-33, No. 3, March 1986).

Figure 8:
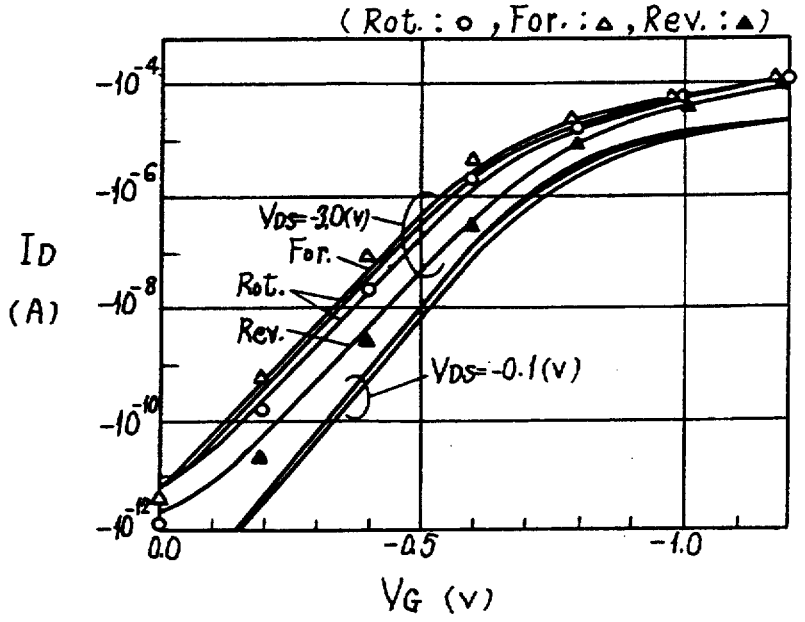
FIG. 8 is a graph showing the subthreshold characteristic result of the EPS structure MOS field effect transistor.

These n-type EPS regions 75s and 75d are to improve the degradation of electrical characteristics of the subthreshold region as a shrink of minimum feature size of a device and are to contribute to enhancement of characteristics of a p-channel MOS transistor, in particular. When formed asymmetrically at the time of ion implantation, for example, the n-type EPS region 75s formed at the shade side of the gate electrode 73 is shifted to the source/drain region 78s side, so that the effect of the n-type EPS region 75s is weakened. To the contrary, since the n-type EPS region 75d formed at the unshaded to non-shadow side of the gate electrode 73 is shifted to the channel region 74 side, the effect of the n-type EPS region 75d is intensified. Therefore, when operated using the region 75s as the source (forward operation, as the drain voltage increases, the threshold voltage becomes lower, and the channels come to be likely to be inverted (the curve of For. in FIG. 8). To the contrary, when operated using the region 75d as the source (reverse operation), if the drain voltage increases, the threshold voltage is kept at a high level, so that the electrical characteristics of the device are asymmetrical (the curve of Rev. in FIG. 8). Accordingly, by employing the four-rotation ion implantation which is an ion implantation method of this invention, when the n-type EPS region is formed to be symmetrical, if operated by exchanging the source and drain, the subthreshold characteristics are almost identical (the curves of Rot. in FIG. 8).

Now, referring to FIGS. 9A to 9G, an example of applying this embodiment in the method of fabrication of an EPS structure MOS field effect transistor is briefly explained below.

Figure 9A:
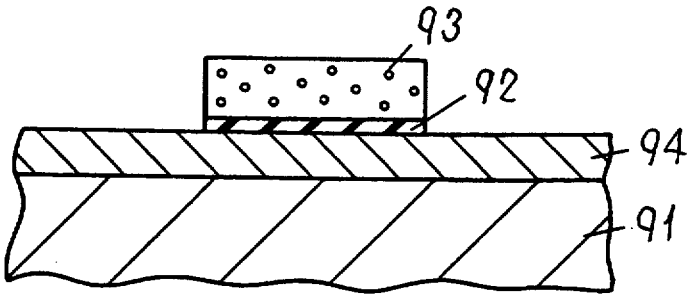
FIG. 9A to FIG. 9C are process drawings of the sectional view along the channel longitudinal direction to show an example applying this invention into a method of fabricating an EPS structure MOS field effect transistor.

After forming a p-type impurity diffusion layer 94 which becomes a buried channel in the transistor forming region of the semiconductor substrate in which an n-well 91 is formed, a gate electrode composed of gate insulation film 92 and polysilicon 93 is formed (FIG. 9A).

Figure 9B:
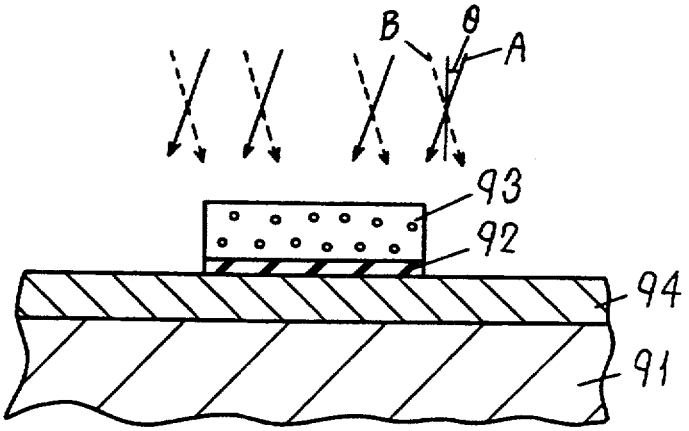
Figure 9C:
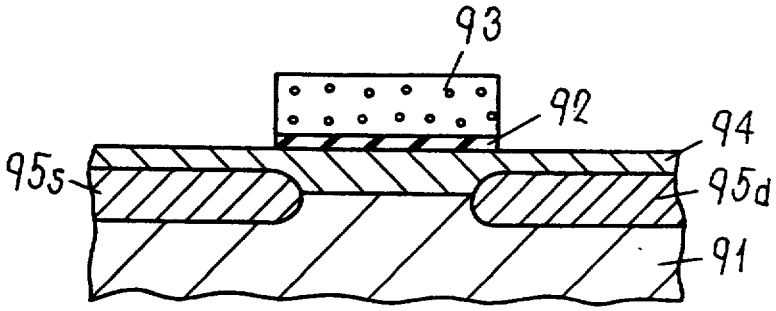

Next, in order to form an EPS region, ions are implanted using the gate electrode as the mask, and an n-type impurity diffusion layer 95s and 95d is formed (FIGS. 9B and C). At this time, the fourrotation ion implantation method was employed (FIG. 9B), which is similar to FIG. 6B in the fabricating method of the LDD structure MOS field effect transistor. The angle of one rotation was 90 degrees, and phosphorus was used as the impurity element, and the implantation energy was 130 keV and the total dose was $2.4\times10^{12}$ dose/cm$^2$. The dose of each implantation was $6\times10^{11}$ dose/cm$^2$.

Figure 9D:
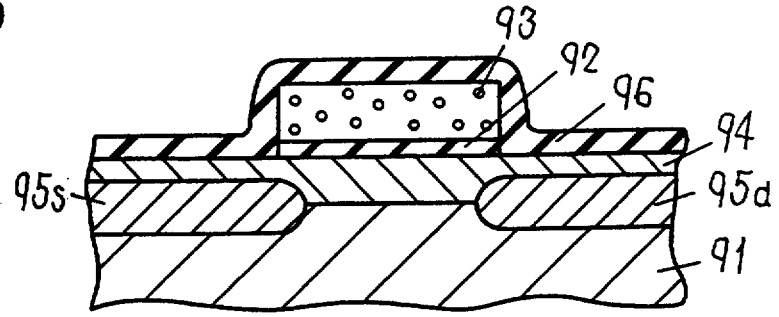
Figure 9E:
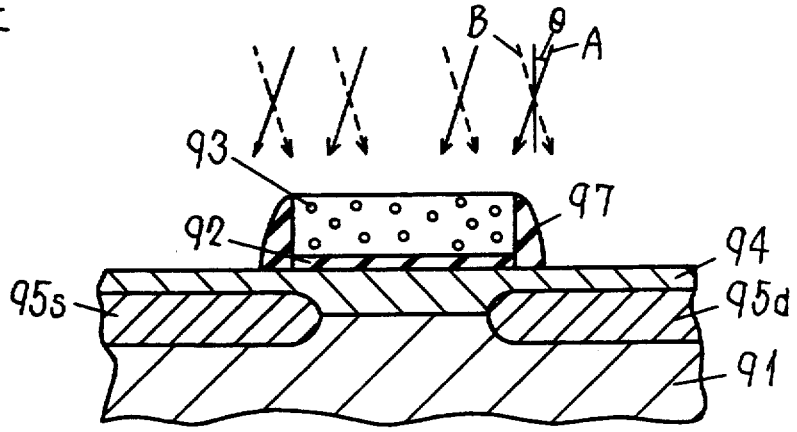
Figure 9F:
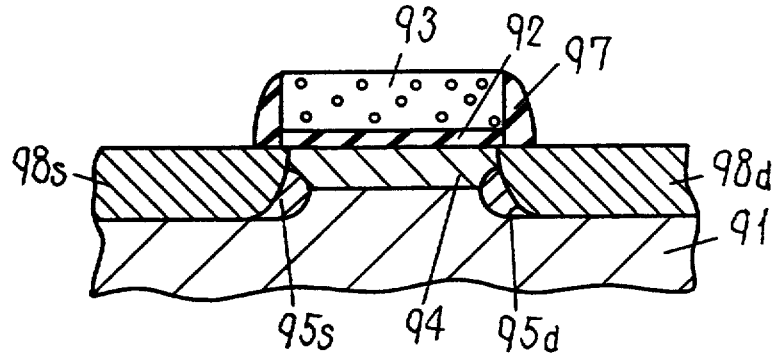
Figure 9G:
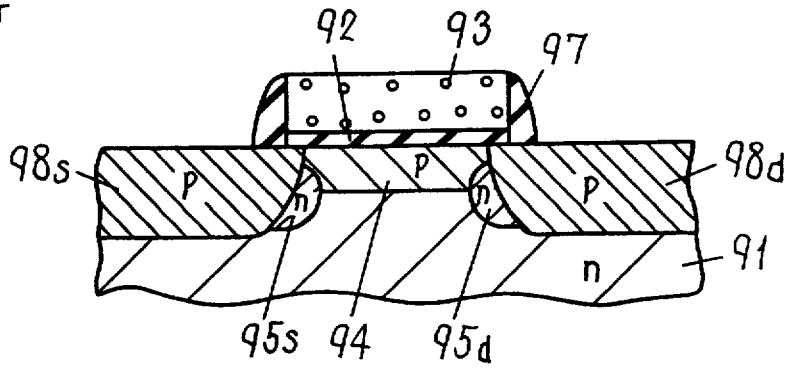

After forming the n-type EPS region (FIG. 9C), an insulation film side wall 97 is formed, the same as in FIGS. 6D and E (FIGS. 9D and E). In succession, to form source and drain regions (p+ layers), impurity diffusion layers 98s and 98d are formed by the four-rotation ion implantation method as when forming the n-type EPS region (FIGS. 9E and F). At this time, $BF_2^+$ was used as the impurity element, and the implantation energy was 40 keV, and the total implantation dose was $4.0\times10^{15}$ dose/cm$^2$. The dose of each implantation was $1.0\times10^{15}$ dose/cm$^2$. Finally, after heat treatment, an EPS structure MOS field effect transistor as shown in FIG. 9G is obtained. In this embodiment, as clear from the description above, the n-type EPS region can be formed symmetrically with respect to the gate electrode and the effect of the n-type EPS region can be maintained, so that the transistor characteristics may be symmetrical regardless of the direction of source and drain.

Incidentally, in the steps of FIGS. 9B and E, the four-rotation ion implantation method was employed, but the two-rotation ion implantation may be similarly applied. At this time, the asymmetrical shape will be at least improved. Similarly it is also possible to implant ions while rotating the semiconductor substrate continuously.

Meanwhile, the process and device parameters used in the device formation in FIG. 8 and FIGS. 9A to G were as follows. The impurity doping for threshold voltage control is $BF_2^+$ with 50 keV, $2.2\times10^{12}$ dose/cm$^2$, the impurity doping for EPS region is phosphorus with 130 keV, $2.4\times10^{12}$ dose/cm$^2$, and the impurity doping for source and drain regions is $BF_2^+$ with 40 keV, $4.0\times10^{15}$ dose/cm$^2$. The gate oxide film thickness is 10 nm, the gate electrode height is 450 nm, the gate electrode length is 0.8 μm, the channel width is 10 μm, the insulation film side wall thickness is 0.14 μm, and the total heat treatment process after forming the gate electrode is 30 minutes at 900° C.

Incidentally, the transistor shown in FIG. 9 is a p-channel MOS, but it is evident that this invention may be similarly applied to an n-channel MOS transistor, too.

Thus, as clear from the description made so far, by conforming to the ion implantation method of this invention, the impurity diffusion layer may be formed symmetrically with respect to the gate electrode, and the electrical characteristics of individual transistors in the semiconductor integrated circuit may be uniformly matched, and its practical effect is extremely great.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

[1. A method of fabricating a field effect transistor comprising the steps of:

forming a gate electrode on a semiconductor substrate by way of a gate insulation film;

forming an impurity diffusion layer by implanting ions into said semiconductor substrate using said gate electrode as the mask, by inclining the direction of an ion beam with respect to said semiconductor substrate surface for said ion implantation; and repeating said ion implantation step 4m times (m is a positive integer) by rotating said semiconductor substrate in planarity, the angle of rotation of said semiconductor substrate for each ion implantation being 90/m degrees.]

[2. A method of fabricating a field effect transistor as set forth in claim 1, wherein m is 1.]

3. A method of fabricating a field effect transistor comprising the steps of:

forming a gate insulation film on a semiconductor substrate and forming a gate electrode on the gate insulation film;

forming a first impurity diffusion layer by first ion implantation on said semiconductor substrate using said gate electrode as the mask, by inclining the direction of an ion beam for said *first* ion implantation with respect to said semiconductor substrate surface;

repeating said first ion implantation [step] by rotating said semiconductor substrate in planarity, *wherein the number of ion implantations is 4m times (m is a positive integer), and the angle of rotation of the semiconductor substrate for each step is 90/m degree;* forming an insulation film on said semiconductor substrate and the gate electrode, and partially removing said insulation film, leaving said insulation film only on the side of the gate electrode, so as to form a gate electrode insulation film side wall;

forming a second impurity diffusion layer, overlapping said first impurity diffusion layer, by second ion implantation on said semiconductor substrate using the gate electrode having said gate electrode insulation film side wall as the mask, by inclining the emission direction of an ion beam for said *second* ion implantation with respect to said semiconductor substrate surface[; and repeating said second ion implanting step by rotating said semiconductor substrate in planarity].

4. A method of fabricating a field effect transistor as set forth in claim 3, further comprising a step of heat treatment after forming said second impurity layer.

[5. A method of fabricating a field effect transistor as set forth in claim 3, wherein, when the number of said ion implantation is 2n times (n is a positive integer), the angle of rotation of said semiconductor substrate for each ion implantation is 180/n degrees.]

[6. A method of fabricating a field effect transistor as set forth in claim 3, wherein, the number of said ion implantations is 4m times (m is a positive integer), and the angle of rotation of the semiconductor substrate for each ion implantation is 90/m degrees.]

[7. A method of fabricating a field effect transistor as set forth in claim 3, wherein ions are implanted continuously while rotating the semiconductor substrate continuously.]

[8. A method of fabricating a field effect transistor as set forth in claim 5, wherein n is 1.]

9. A method of fabricating a field effect transistor as set forth in claim [6] *3*, wherein m is 1.

10. A method of fabrication a field effect transistor comprising the steps of:

forming a buried channel layer on a semiconductor substrate, forming a gate insulation film, and forming a gate electrode on the gate insulation film;

forming a first impurity diffusion layer in the boundary region of said buried channel layer and the semiconductor substrate by implanting *a first implantation of* ions in said buried channel layer using said gate electrode as the mask, by inclining the emission direction of an ion beam for said *first* ion implantation with respect to said semiconductor substrate;

repeating said first ion implantation by rotating said semiconductor substrate in planarity, *wherein the*

*number of ion implantations is 4m times (m in a positive integer), and the angle of rotation of the semiconductor substrate for each step is 90/m degrees;* forming an insulation film on said buried channel layer and the gate electrode, and partially removing said insulation film, leaving said insulation film only on the side of the gate electrode, so as to form a gate electrode insulation film side wall;

forming a second impurity diffusion layer, reaching up to the [principal] *substrate surface* plane of said buried channel layer on said first impurity diffusion layer by a second ion implantation in the buried channel layer using the gate electrodes having said gate electrode insulation film side wall as the mask, by inclining the direction of an ion beam for said *second* ion implantation with respect to said buried channel layer surface[; and repeating said second ion implantation step by rotating said semiconductor substrate in planarity].

11. A method of fabricating a field effect transistor as set forth in claim 10, further comprising a step of heat treatment after forming said second impurity diffusion layer.

[12. A method of fabricating a field effect transistor as set forth in claim 10, wherein, when the number of said ion implantation is 2n times (n is a positive integer), the angle of rotation of the semiconductor substrate for each ion implantation is 180/n degrees.]

[13. A method of fabricating a field effect transistor as set forth in claim 10, wherein, the number of said ion implantations is 4m times (m is a positive integer), and the angle of rotation of the semiconductor substrate for each ion implantation is 90/m degrees.]

[14. A method of fabricating a field effect transistor as set forth in claim 10, wherein ions are implanted continuously while rotating the semiconductor substrate continuously.]

[15. A method of fabricating a field effect transistor as set forth in claim 12, wherein n is 1.]

16. A method of fabricating a field effect transistor as set forth in claim [13] *10*, wherein m is 1.

[17. A method of fabricating a field effect transistor comprising the steps of:

forming a gate electrode on a semiconductor substrate by way of a gate insulation film; and forming an impurity diffusion layer by implanting ions into said semiconductor substrate using said gate electrode as the mask, by inclining the direction of an ion beam with respect to said semiconductor substrate surface for said ion implantation, said ion implantation being carried out continuously while said semiconductor substrate is rotated k times (k is a positive integer) in planarity, the substrate being rotated at least 360 degrees during the continuous step of implantation.]

[18. A method of fabricating a field effect transistor as set forth in claim 17, wherein k is 1.]

*19. A method of fabricating a field effect transistor comprising the steps of:*

*forming a gate insulation film on a semiconductor substrate and forming a gate electrode on the gate insulation film;*

*forming a first impurity diffusion layer by first ion implantation on said semiconductor substrate using said gate electrode as the mask, by inclining the direction of an ion beam for said ion implantation with respect to said semiconductor substrate surface;*

*repeating said first ion implantation step by rotating said semiconductor substrate in planarity;*

*forming an insulation film on said semiconductor substrate and the gate electrode, and partially removing said insulation film, leaving said insulation film only on the side of the gate electrode, so as to form a gate electrode insulation film side wall; and*

*forming a second impurity diffusion layer, overlapping said first impurity diffusion layer, by second ion implantation on said semiconductor substrate using the gate electrode having said gate electrode insulation film side wall as the mask, by inclining the emission direction of an ion beam for said ion implantation with respect to said semiconductor substrate surface.*

*20. A method of fabricating field effect transistors as set forth in claim 3, wherein the process of forming gate electrodes on a gate insulation film comprises the steps of forming an elongated first gate electrode for a first transistor and forming an elongated second gate electrode for a second transistor with the directions of elongation of the respective gate electrodes being substantially orthogonal to each other.*

*21. A method of fabricating field effect transistors as set forth in claim 10, wherein the process of forming gate electrodes on a gate insulation film comprises the steps of forming an elongated first gate electrode for a first transistor and forming an elongated second electrode for a second transistor with the directions of elongation of the respective gate electrodes being substantially orthogonal to each other.*

*22. A method of fabricating a field effect transistor comprising the steps of:*

*forming a buried channel layer on a semiconductor substrate, forming a gate insulation film, and forming a gate electrode on the gate insulation film;*

*forming a first impurity diffusion layer in the boundary region of said buried channel layer and the semiconductor substrate by a first implantation of ions in said buried channel layer using said gate electrode as the mask, by inclining the emission direction of an ion beam for said ion implantation with respect to said semiconductor substrate;*

*repeating said first ion implantation by rotating said semiconductor substrate in planarity;*

*forming an insulation film on said buried channel layer and the gate electrode, and partially removing said insulation film, leaving said insulation film only on the side of the gate electrode, so as to form a gate electrode insulation film side wall; and*

*forming a second impurity diffusion layer reaching up to the substrate surface plane of said buried channel layer on said first impurity diffusion layer by second ion implantation in the buried channel layer using the gate electrode having said gate electrode insulation film side wall as the mask, by inclining the direction of an ion beam for said second ion implantation with respect to said buried channel layer surface.*

* * * * *